United States Patent
Routh et al.

(10) Patent No.: US 11,209,923 B2
(45) Date of Patent: Dec. 28, 2021

(54) PROTECTIVE FILM FOR METAL MESH TOUCH SENSOR

(71) Applicant: FUTURETECH CAPITAL, INC, Palo Alto, CA (US)

(72) Inventors: Robert Routh, Latham, NY (US); Michael Morrione, Jackson, CA (US)

(73) Assignee: FUTURETECH CAPITAL, INC., Palo Alto, CA (US)

( * ) Notice: Subject to any disclaimer, the term of this patent is extended or adjusted under 35 U.S.C. 154(b) by 0 days.

(21) Appl. No.: 15/929,435

(22) Filed: May 1, 2020

(65) Prior Publication Data

US 2021/0342026 A1 Nov. 4, 2021

(51) Int. Cl.
*G06F 3/041* (2006.01)
*H05K 3/28* (2006.01)

(52) U.S. Cl.
CPC ............ *G06F 3/0412* (2013.01); *H05K 3/287* (2013.01); *G06F 2203/04103* (2013.01); *G06F 2203/04112* (2013.01)

(58) Field of Classification Search
CPC ......... G06F 3/0412; G06F 2203/04103; G06F 2203/04112; H05K 3/287
See application file for complete search history.

(56) References Cited

U.S. PATENT DOCUMENTS

| | | | |
|---|---|---|---|
| 10,925,160 B1* | 2/2021 | Tam | H05K 9/0054 |
| 2016/0291478 A1* | 10/2016 | Petcavich | G06F 3/044 |
| 2017/0010710 A1* | 1/2017 | Kim | C09D 175/04 |
| 2017/0022343 A1* | 1/2017 | Sakakibara | C08J 7/043 |

\* cited by examiner

*Primary Examiner* — Peter D McLoone
(74) *Attorney, Agent, or Firm* — Womble Bond Dickinson (US) LLP; Joseph Bach, Esq.

(57) ABSTRACT

Touchscreen, comprising: a display device; a touch sensor over the display device; and, a cover lens; wherein the touch sensor comprises: a transparent substrate; a layer of catalytic photoresist patterns of a catalytic photoresist composition, the catalytic photoresist composition including a photoresist and catalytic nanoparticles; a metal conductive layer with conductive patterns over the layer of catalytic photoresist patterns; a metal passivation layer over the metal layer; and a transparent protective layer over the metal passivation layer.

22 Claims, 3 Drawing Sheets

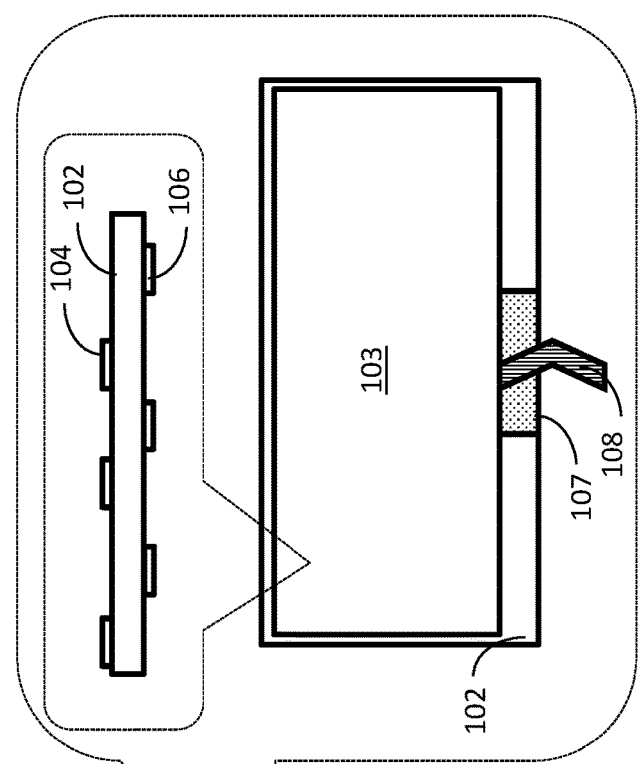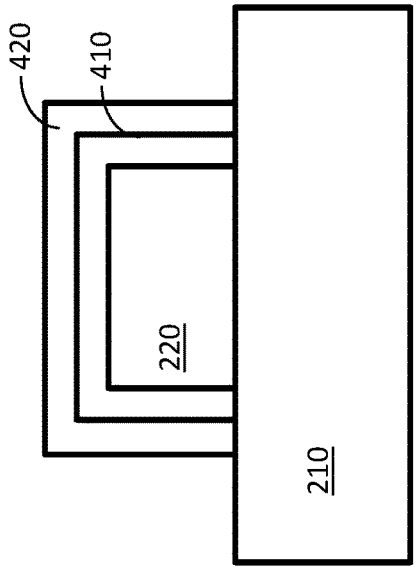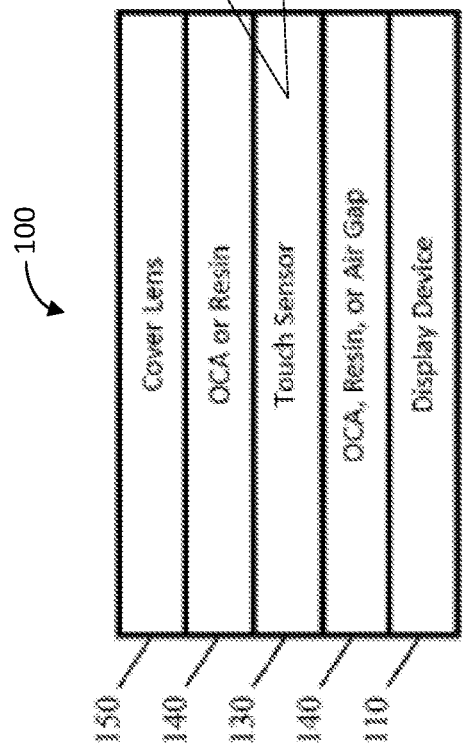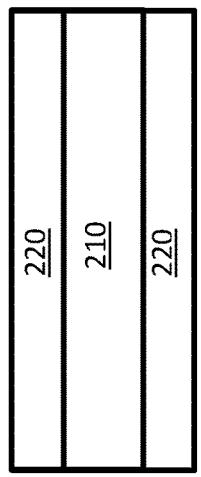

PROTECTIVE FILM FOR METAL MESH TOUCH SENSOR

TECHNICAL FIELD

Embodiments of the present disclosure relate generally to touch screens. More particularly, embodiments of the disclosure relate to touch sensors with metallic micro-mesh.

BACKGROUND

A touch screen enabled system allows a user to control various aspects of the system by finger touch or stylus motion on the screen. A user may interact directly with one or more objects depicted on a display device by fingers or stylus that are sensed by the touch sensor. The touch sensor typically includes a conductive pattern disposed on a substrate configured to sense the exact position of the finger or stylus. Touch screens are commonly used in consumer, commercial, and industrial systems.

The conductive pattern of touch screens has been traditionally made from transparent conductive material, such as indium tin oxide (ITO). However, with the advent of multi-touch screen systems and large displays, it is advantageous to have highly conductive micro mesh systems, for example, conductive metal mesh systems using copper fine lines. Copper is a much better conductor than transparent conductors such as ITO. However, there are a number of challenges with highly conductive metallic mesh touch sensors. For example, copper or copper alloys are prone to surface oxidation on exposure to ambient conditions and are prone to corrosion in certain environmental conditions.

Specifically, with respect to reliability and environmental performance metrics, a conductive pattern is prone to degradation from use and other causes overtime. Depending on the type of degradation, the reliability may be affected by the development of electrical opens or electrical shorts upon continued operation. Consequently, the reliability, functionality, and useable life of the conductive pattern, or a touch sensor in which it may be disposed, may be substantially reduced. Degradation may occur as a result of oxidation, day-to-day usage, electro-migration, airborne, solution-based, or liquid based exposure to the environment, and/or exposure to corrosive agents such as soft drinks, coffee, oils, bodily fluids, acids, caustics, atmospheric pollutants, environmental pollutants, salt water, or water with contaminants such as salts, minerals, or ions.

In order to prevent such degradation, the touch sensor is protected within the assembled touch screen module. However, depending on the supply chain complexity, a delay of several days to several weeks can occur between the completed manufacturing of the metal mesh touch sensor and the integration of the touch sensor into the touch screen module. Therefore, the metal mesh touch screen sensor must be protected against environmental conditions in the interim period.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

Disclosed herein is a method for manufacturing a touch sensor with a protective layer over the conductive metallic micro-mesh. The method provides solutions to the potential degradation that may occur, especially in the period from the manufacturing of the touch sensor to the integration of the sensor into a touch screen module.

In disclosed aspects, a thin layer of a transparent protective coating is formed over the entire touch sensor. The layer may be formed from a mixture of monofunctional acrylic oligomers and solvent. If curing is to be done by irradiation, then photo initiators may also be included in the solution. Once coated, the layer is exposed to curing process to cause cross linking of the coating solution.

In an aspect of the disclosure, a method of manufacturing a touch sensor with a protective coating is provided. The method comprises applying catalytic photoresist composition onto a transparent substrate of the touch sensor; photo patterning the catalytic photoresist composition to have a layer of catalytic photoresist pattern; plating a metal layer on the layer of catalytic photoresist pattern thereby forming the conductive micro-mesh; applying a metal passivation layer over the metal layer; applying a clear protective coating over the metal passivation layer; and curing the protective coating.

In an aspect of the disclosure, a touch sensor with a protective coating is disclosed. The touch sensor comprises a transparent substrate, a layer of catalytic photoresist patterns made of a catalytic photoresist composition, the catalytic photoresist composition including a photoresist and catalytic nanoparticles; a metal conductive layer with conductive patterns forming a conductive mesh over the layer of catalytic photoresist patterns; a metal passivation layer over the metal layer; and a clear protective coating over the metal passivation layer.

In further aspects of the disclosure, a touch screen is provided having touch sensor with a protective coating over the metallic conductive micro-mesh. The touch screen comprises a display layer, e.g., an LCD, an OLED, etc., a touch sensor adhered to the display layer with an optically clear adhesive, and a cover glass over the touch screen. The touch sensor comprises a transparent substrate, and a layer of catalytic photoresist patterns of a catalytic photoresist composition, the catalytic photoresist composition including a photoresist and catalytic nanoparticles. The touch sensor further comprises a metal conductive layer with conductive patterns on the layer of catalytic photoresist patterns. The touch sensor further comprises a clear protective coating over the metal layer.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

Embodiments of the disclosure are illustrated by way of example and not limitation in the figures of the accompanying drawings in which like references indicate similar elements.

FIG. 1 is a block diagram illustrating a cross section of a touch screen according to some embodiments.

FIGS. 2A-2D are block diagrams illustrating an example of a cross-section view of a touch sensor according to some embodiments.

DETAILED DESCRIPTION

Figure 3:
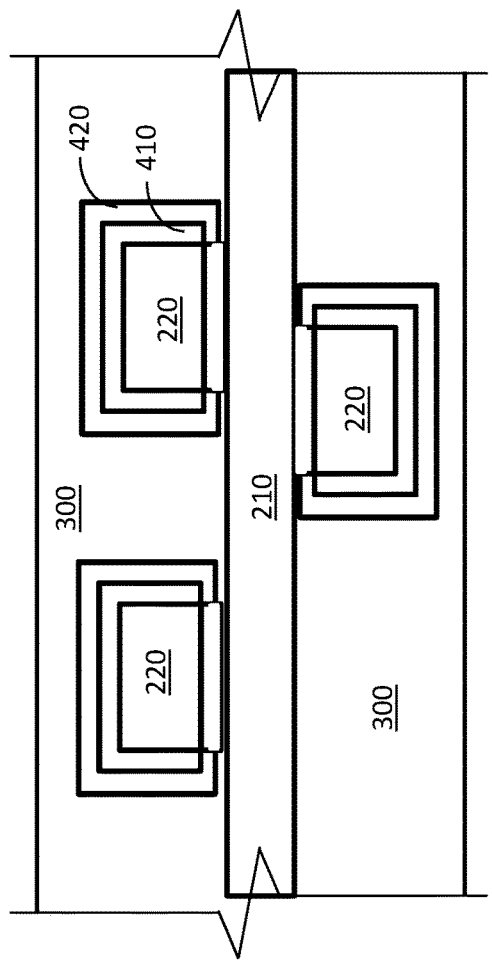
FIG. 3 is a block diagrams illustrating an example of a cross-section view of a touch sensor according to some embodiments.

Various embodiments and aspects of the disclosures will be described with reference to details discussed below, and the accompanying drawings will illustrate the various embodiments. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosures.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

Embodiments of the inventive metallic mesh touch sensor will now be described with reference to the drawings. Different embodiments or their combinations may be used for different applications or to achieve different benefits. Depending on the outcome sought to be achieved, different features disclosed herein may be utilized partially or to their fullest, alone or in combination with other features, balancing advantages with requirements and constraints. Therefore, certain benefits will be highlighted with reference to different embodiments, but are not limited to the disclosed embodiments. That is, the features disclosed herein are not limited to the embodiment within which they are described, but may be "mixed and matched" with other features and incorporated in other embodiments.

FIG. 1 shows a cross-section of a touch screen 100 which may implement a touch sensor in accordance with embodiments of the present disclosure. Touch screen 100 includes a display device 110 (e.g., LCD, OLED, etc.) and a touch sensor 130 that overlays at least a portion of a viewable area of display device 110. In certain embodiments, an optically clear adhesive ("OCA") or resin 140 may bond a bottom side of touch sensor 130 to a top, or user-facing, side of display device 110. In other embodiments, an isolation layer or air gap 140 may separate the bottom side of touch sensor 130 from the top, or user-facing, side of display device 110. A transparent cover lens 150 may overlay a top, or user-facing, side of touch sensor 130. The transparent cover lens 150 may be composed of polyester, glass, or any other material suitable for use as a cover lens 150. In certain embodiments, an OCA or resin 140 may bond a bottom side of the transparent cover lens 150 to the top, or user-facing, side of touch sensor 130. A top side of transparent cover lens 150 faces the user and protects the underlying components of touch screen 100. Incidentally, in this disclosure the term top or upper refers to the side facing the user when the touch screen is in use, while bottom or lower indicate the direction away from the user.

The components and/or the stack of touch screen 100 may vary based on an application or design in accordance with some embodiments of the present disclosure. The touch sensor 130, or the function that the touch sensor implements, may be integrated into the display device 110 stack (not independently illustrated) in accordance with some embodiments of the present disclosure.

The callout in FIG. 1 illustrates a cross section of a small section of the touch sensor 130 and a top view of a generic layout of a touch sensor 130. Generally, the touch sensor 130 comprises a transparent substrate 102, which may be larger than the viewable area of the display device. The transparent substrate 102 includes a touch sensing area 103, upon which a top conductive mesh 104 and a bottom conductive mesh 106 are formed. The top mesh 104 and the bottom mesh 106 form a plurality of addressable intersections. The position of the finger touch or stylus on the sensor is sensed at each of the intersections and the signal is transmitted to contacts at the bond pads area 107. A flex cable 108 is attached to the contacts of the bond pad area to transmit the signal to the processor of the touch screen.

Historically, the top and bottom meshes of the touch sensors were made from transparent conductive material such as indium tin oxide. However, current technologies require highly conductive micro meshes, which lead to developments of conductive micro mesh systems made from copper or copper alloy fine lines. Copper, as is well known, tends to rather rapidly degrade if not well protected. Therefore, it has been suggested that a second metal layer, such as palladium or nickel, can be plated over the copper conductor layer to help passivate the copper and reduce oxidation. The second metal layer of palladium or nickel will also serve to reduce the visibility of light reflected off of the copper conductor.

It has been discovered by the subject inventors that while the second metal layer does delay oxidation and corrosion, it does not eliminate it. Specifically, the second metal layer provides the initial protection until the touch sensor is assembled into a touch screen, which provides further protection from the environment, especially when OCA is used on the top and bottom of the touch sensor. The subject inventors noted that the intermediate protection provided by the second metal layer may not be adequate for the supply chain delay, where the touch sensor is still exposed to the environment before assembly into a touch module with adequate sealing against the environment.

The reasons for potential degradation in spite of the second metal layer may be better understood in relation to the following description of the fabrication process of the touch sensor.

FIG. 2A is a block diagram illustrating an example of a cross-section view of the first step in producing a touch sensor, e.g., sensor 100, according to some embodiments (only a small section of the sensor is shown). The touch sensor may have an optically transparent substrate 210, e.g., a flexible polymer film. A catalytic photoresist composition 220 may be formed by dispersing catalytic nanoparticles, e.g., silver nanoparticles, into a photoresist. The catalytic photoresist composition 220 is applied to the optically transparent substrate 210 and is subsequently photo exposed, developed, and etched, to form the grid design, as illustrated in FIG. 2B. The function of the catalytic photoresist 220 is to enable the electroless deposition of copper or copper alloy, thus forming the micro-mesh.

With respect to the transparent substrate 210 (and other references to transparent or clear in this disclosure), "transparent" or "clear" may refer to being capable of transmitting a substantial portion of visible light through the medium which is suitable for a given touch sensor application or design. In some touch sensor applications, "transparent" may refer to transmittance of at least 85% of incident visible light through the medium. However, other transmittance values may be desirable for other touch sensor applications or designs.

In certain embodiments, transparent substrate 210 may be polyethylene terephthalate ("PET"), polyethylene naphthalate ("PEN"), cellulose acetate ("TAC"), cycloaliphatic hydrocarbons ("COP"), polymethylmethacrylates ("PMMA"), polyimide ("PI"), bi-axially-oriented polypropylene ("BOPP"), polyester, polycarbonate, glass, copolymers, blends, or combinations thereof. In other embodiments, transparent substrate 210 may be any other transparent material suitable for use as a touch sensor substrate such as eagle glass, flexible glass, and quartz. The composition of transparent substrate 210 may vary based on an application or design.

The catalytic photoresist composition 220 may include a positive or negative photoresist component and a catalyst component that may include catalytic nanoparticles. In some embodiments, the negative photoresist may be advantageous. In some embodiments, the negative photoresist may be acrylic phenolic polymer. In other embodiments, the negative photoresist may be acrylic, epoxy, urethane, or combinations of one or more of the aforementioned compositions. The negative photoresist may vary in accordance with some embodiments of the present disclosure.

In some embodiments, the catalytic nanoparticles may be silver nanoparticles, and in some embodiments the nanoparticles may be coated with carbon. In other embodiments, the catalytic nanoparticles may be copper-oxide carbon coated nanoparticles. Metal reflection may be reduced by the carbon absorbing the light. In still other embodiments, the catalytic nanoparticles may be dark palladium. The type of catalytic nanoparticles may vary based on an application or a design.

The catalytic nanoparticles are embedded in the photoresist in order to form nucleation sites for the electroless deposition of copper. By having catalyst nanoparticles in the photoresist composition, and then patterning the photoresist, the catalyst nanoparticles will form nucleation sites only over the developed photoresist, so as to form the mesh design. Notably, contrary to other semiconductor manufacturing, where the photoresist is used for the delineation of the circuit feature and is thereafter removed, in touch sensors having electroless copper lines the catalytic photoresist remains part of the finished touch sensor.

In certain embodiments, the catalytic photoresist composition 220 may include negative photoresist component content in a range between approximately 30 percent and approximately 95 percent by weight and catalyst component content in a range between approximately 5 percent and approximately 70 percent by weight. In other embodiments, the catalytic photoresist composition 220 may include negative photoresist component content in a range between approximately 50 percent and approximately 70 percent by weight and catalyst component content in a range between approximately 30 percent and approximately 50 percent by weight. For example, the photoresist may be an epoxy-based negative resist SU8.

In some embodiments, the size of the catalytic nanoparticles may range from 5 to 250 nanometers, for example, the catalytic nanoparticles may have a size of 15-25 nanometers. The nanoparticles have a metallic core and a carbon coating.

The catalytic nanoparticle composition 220 may be applied to the substrate 210 by a number of techniques such as gravure, reverse gravure, slot die, spray, flexographic, or Meyer rod techniques. The catalytic nanoparticle composition 220 after drying and baking may range in thickness from 1 to 100 microns. For example, the catalytic nanoparticle composition 220 may have a thickness of 5 to 25 microns. After application to the substrate 210, the multilayer stack may be exposed to UV radiation.

The UV radiation from an external source may be applied to the transparent substrate 210 to form the mesh pattern design. The UV radiation incident on a photomask (not shown) may pass through a negative image of a conductive pattern onto the catalytic photoresist composition 220 disposed on the transparent substrate 210. This transfers the pattern design from the mask to the photoresist.

After the UV radiation from the external source is applied to the transparent substrate 210, a developer may be applied to the catalytic photoresists composition 220. In some embodiments, the developer may include a water-based alkaline solution. In other embodiments, the developer may include an organic solvent such as, for example, Carbitol™, or Dowanol™. The composition of the developer may vary with the catalytic photoresist composition in accordance with some embodiments of the present disclosure.

The developer may loosen or remove unexposed portions of the catalytic photoresists composition 220, leaving a catalytic photoresist image of the conductive pattern on the transparent substrate 210. In certain embodiments, an optional hard bake may be performed on the transparent substrate 210 after development. Hard-bake typically includes heating the transparent substrate 210 to a sufficient temperature for a sufficient amount of time to stabilize and harden the developed catalytic photoresist composition 220 prior to stripping. The temperature and the amount of time required to hard-bake may vary based on the composition and the applied thickness of the catalytic photoresist composition 220. After development, any remaining catalytic photoresist composition 220 not exposed to UV radiation is stripped, leaving catalytic photoresist patterns in the image of the pattern on the transparent substrate 210.

FIG. 2C is a block diagram illustrating an example of a cross sectional view of one lines of the micro-mesh after photolithography processing and electroless plating, according to some embodiments. As illustrated in FIG. 2C, a layer of metal 410 may be plated on the remaining catalytic photoresist composition 220, thereby forming the conductive patterns of the conductive mesh on the transparent substrate 210. In some embodiments, an electroless plating process may be used to electroless plate a first metal 410 on the catalytic photoresist composition patterns 220 disposed on the substrate 210. In other embodiments, an immersion bath process may be used to immersion plate a first metal 410 on the catalytic photoresist composition 220. Other methods of disposing metal on the catalytic photoresist composition pattern 220 may be used as well, but in the embodiments of FIG. 2C the benefit of having catalyst embedded in the photoresist are taken advantage of. The conductive lines 410 form part of a conductive metal mesh for the sensor. When a width of the conductive line 410 is small, e.g., in microns, the conductive patterns result in a conductive micro-mesh for the sensor, which is too thin to be visible to the user.

In some embodiments, the first metal 410 may be copper. In other embodiments, the first metal may be copper alloy. Other metals or metal alloys may be used as well, especially metals that interact with the catalyst nanoparticles. In certain embodiments, more than one metal layers may be disposed on the patterned catalytic photoresist composition 220.

In certain embodiments, an opaque metal passivation layer 420, for example, palladium, or other opaque protective coating, may be applied, e.g., by electroless plating, over the metal 410 to protect the metal 410 from corrosion and other environmental failure. Additionally, the metal passivation layer 420 may impart a dull gray black color that reduces or minimizes reflections from the metal, e.g., copper, plated micro-mesh features.

As noted, the metal lines are rather thin, in the range of 200-400 nanometer, and are formed over a photoresist base. Consequently, the photoresist, copper and palladium boundary may form a weak point. The photoresist is a gas permeable material and there is a relatively short distance at the boundary for a gas like oxygen to diffuse through the photoresist into the edge of the copper layer to thereby oxidize the copper.

To overcome environmental reliability issues as noted above, in disclosed embodiments a protective coating is provided that protects the touch sensor especially during the time prior to its integration in a touch screen. The protective coating becomes an integral part of the sensor and therefore also a part of the touch screen after integration. By implementing the disclosed protective coating, the touch sensor shelf life is dramatically enhanced, such that a delay in integration is not detrimental to the performance of the touch sensor.

In some specific examples, the protective coating is formed by preparing a protective coating solution of 70%-80% monofunctional acrylic oligomers and 20%-30% solvent, which may be thermally cured. The solution is coated on the front surface and on the opposite surface of the touch sensor, so as to cover the metal conductor traces (micromesh) of the touch screen sensor. The protective coating solution is then cured to cross link the coating solution. Curing may be done by thermal or irradiation, e.g., by UV light, but if UV curing is intended, then 1%-6% of photoinitiators should be included in the solution.

Since the protective coating remains a part of the touch screen, it must be transparent and have a high optical quality and must be devoid of pinholes. Therefore, in disclosed embodiments a process of filtering and degassing the protective coating solution prior to coating is performed, so as to eliminate particles and pinholes. In some embodiments, degas filters are used to filter the solution and remove gas from the liquid. An example of degas filter is Liqui-Cel™ available from 3M company. Such filters utilize hollow fiber membrane technology, which allow gas but not liquid to pass through.

In disclosed embodiments the solution is applied to the touch sensor using either gravure or slot die coating methods, which provide a smooth surface finish and good optical properties. The coating in disclosed examples extend over all metal conductor traces and out to the edge of the substrate film, including the bond pad area. A minimum amount of cross-linking should be used to hold the coating in place and to minimize the cured coating hardness. Cross linking can be controlled using the percentage amount of monofunctional acrylic oligomer in the solution and by properly setting the parameters of the thermal or irradiation curing. For example, the temperature and bake time can be set for thermal partial curing or the light output of the UV lamp and the dwell time the coating is exposed to the UV light source can be set for irradiation partial curing.

The coating thickness should be about 1-2 microns thick, 1-3 micron thick, or in places up to 5 micron thick, essentially only thick enough to encapsulate the conductor lines. In example embodiments, the touch sensor is produced in a roll-to-roll fabrication method, in which case gravure or slot die coating method is beneficial method for the coating, but it will also cover the bonding pads. Therefore the coating should still be soft enough through cross linking control and minimum thickness so that the solder particles in the conductive paste used to attach the flexible connector cable to the touch screen sensor bonding pads can penetrate the protective film. This will eliminate the additional process complexity and cost of having to mask the bonding pad area to prevent coating the protective film on the bonding pads. Incidentally, the solder particles are suspended in a thermal solderable anisotropic conductive paste.

Figure 2D:
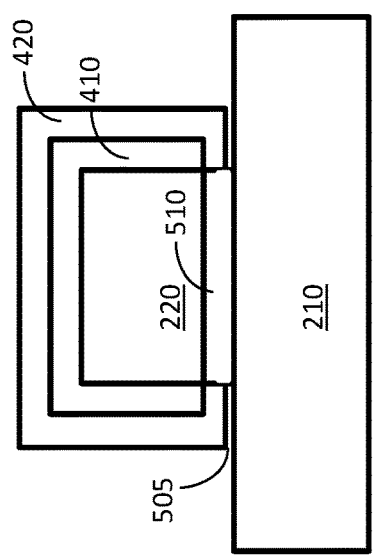

FIG. 2D is a block diagram illustrating an example of a cross-section view of a touch sensor with a photoresist standoff layer 510, according to some embodiments. The photoresist standoff layer 510 may be deposited on the substrate 210 and is made of a photoresist having no catalyst therein. The catalytic photoresist composition layer 220 may be deposited on top of the photoresist standoff layer 510. The catalytic photoresist composition layer 220 may comprise catalytic nanoparticles, e.g., silver nanoparticles. The photoresist standoff layer 510 may be either a positive or negative resist, but include no catalyst. The thickness of the standoff layer 510 can vary from 0.1 to 25 microns. For example, the thickness of the standoff layer 510 may be between 0.5 to 10 microns. The photoresist standoff layer may be applied and processed together with the catalytic photoresist composition layer 220.

The photoresist standoff layer 510 may be used to assist with reducing reflections from the edge of metal plated conductive layer 410. The metal layer 410, e.g., a layer of copper or copper alloy, may be electroless plated. However, since the standoff layer 410 has no catalyst therein, the metal is plated only on the patterned catalytic photoresist layer 220, and not on the standoff layer 510. Consequently, the metal layer 410 does not extend to the substrate, thus forming a gap 505 between the edge of metal line 410 and the substrate 210.

As shown, since the passivation 420 is formed over the metal line 410, the passivation is applied also over the exposed edge of copper line, and may even fill part of the gap 505. In this manner, the photoresist standoff layer 510 enables adding the metal passivation (e.g., dark palladium) conformal coating 420 over the metal (e.g., copper) plated conductive layer 410, including covering the edge of the line formed by conductive layer 410. Nevertheless, the gap 505 may form a point of diffusion for gas into the standoff layer 510 and/or the catalytic photoresist 220, and degrading the copper 410.

FIG. 3 illustrates a cross section of a small part of the touch sensor, having the protective coating 300 formed thereupon. FIG. 3 shows metal lines formed on the top and bottom surfaces of the substrate 210. Protective coating 300 is also formed on the top and bottom surfaces of the substrate, completely covering the metal lines.

Figure 4:
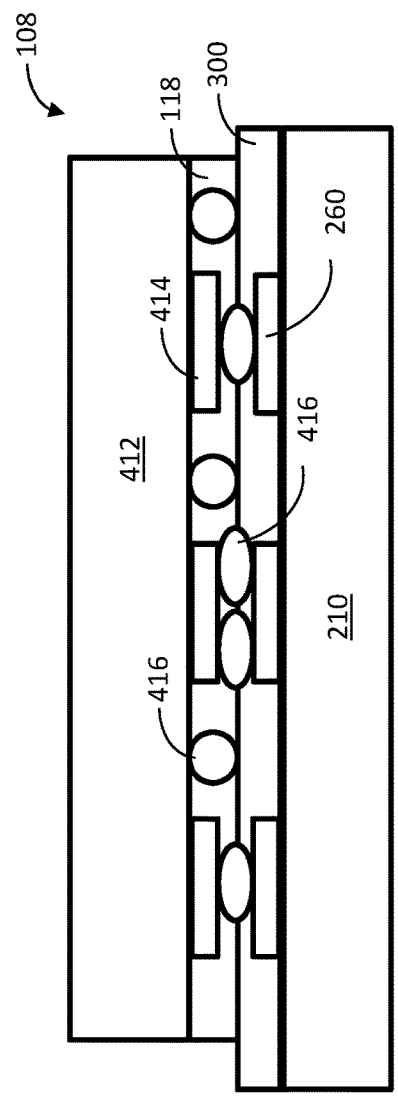
FIG. 4 is a block diagrams illustrating an example of a cross-section view of a bond pad area of a touch sensor according to some embodiments.

FIG. 4 illustrates a cross section of part of the bond pad area of the touch sensor, with part of the flexible cable 108 attached. The bond pad area has a plurality of bond pad contacts 260. The bond pads are also covered by the protective coating 300. The flex cable 108 includes a flex substrate 412 and contacts 414. The flex cable 108 is held to the bond pad area with adhesive 118. Also, the contacts 414 are attached to the bond pads with solder particles 416 that are suspended in the adhesive 118. The solder particles have a diameter of 3-10 micron, such that they are able to penetrate the thin coating covering the bond pads 260.

Figure 5:
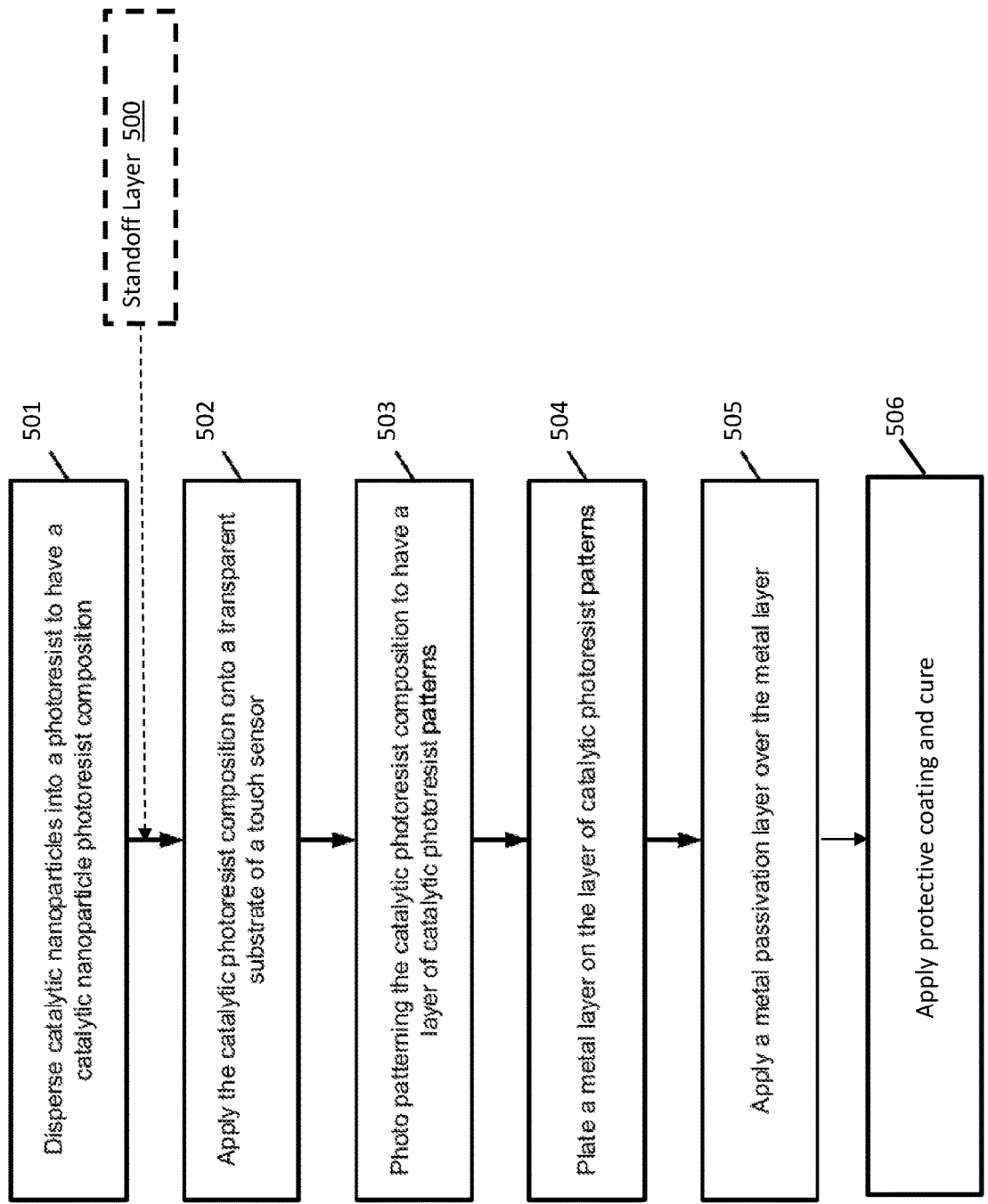
FIG. 5 is a block diagram illustrating a method of manufacturing a conductive mesh touch sensor according to some embodiments.

FIG. 5 is a flow diagram illustrating an example of a method of manufacturing a conductive mesh touch sensor according to some embodiments. At 501, catalytic nanoparticles may be dispersed into a photoresist to produce a catalytic photoresist composition. The composition and type of photoresist, as well as composition and size of the nanoparticles, have been described elsewhere herein. At 502, the catalytic photoresist composition including the photoresist and the catalytic nanoparticles may be applied onto a transparent substrate of the touch sensor. This may be done on a roll-to-roll system using standard techniques, such as gravure, reverse gravure, slot die, spray, flexographic, or Meyer rod techniques. In such case, the substrate is a continuous rolled strip and a plurality of touch sensors are fabricates over the strip, to be cut later into individual sensors. As shown by the dashed lines, a standoff layer may optionally be applied at 500, as described with respect to FIGS. 2D and 3. In such a case, the catalytic photoresist composition is applied over the optional standoff layer.

At 503, the catalytic photoresist composition may be photo patterned to have a layer of catalytic photoresist patterns. If the standoff layer 500 has been applied, the catalytic photoresist composition can be photo patterned and developed together with the standoff layer. At 504, a metal layer may be plated on the layer of catalytic photoresist patterns, e.g., by electroless plating of copper or copper alloy. At 505, a metal passivation layer, e.g., palladium, may be applied over the metal layer by, e.g., electroless plating. At 506 the protective coating is applied over the entire surface of the touch sensor. The coating layer is then cured. In one example, the curing is done by baking at a temperature of from about 100 to about 120 degrees Celsius, for a period of from 30 to about 40 seconds. In other embodiments UV irradiation may be used for curing. The strip may then be cut into individual sensors.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

While the present disclosure has been disclosed in example embodiments, those of ordinary skill in the art will recognize and appreciate that many additions, deletions and modifications to the disclosed embodiments and their variations may be implemented without departing from the scope of the disclosure. A wide range of variations to those implementations and embodiments described herein are possible. Components and/or features may be added, removed, rearranged, or combinations thereof. Similarly, method steps may be added, removed, and/or reordered.

Likewise various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Accordingly, reference herein to a singular item includes the possibility that a plurality of the same item may be present. More specifically, as used herein and in the appended claims, the singular forms "a," "an," "said," and "the" include plural referents unless specifically stated otherwise. In other words, use of the articles allow for "at least one" of the subject item in the description above as well as the claims below.

Additionally as used herein, a phrase referring to "at least one of" a list of items refers to any combination of those items, including single members. As an example, "at least one of: a, b, or c" is intended to cover: a, b, c, a-b, a-c, b-c, and a-b-c.

Certain features that are described in this specification in the context of separate embodiments also can be implemented in combination in a single embodiment. Conversely, various features that are described in the context of a single embodiment also can be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a sub combination.

Similarly, while operations may be described as occurring in a particular order, this should not be understood as requiring that such operations be performed in the particular order described or in sequential order, or that all described operations be performed, to achieve desirable results. Further, other operations that are not disclosed can be incorporated in the processes that are described herein. For example, one or more additional operations can be performed before, after, simultaneously, or between any of the disclosed operations. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single product or packaged into multiple products. Additionally, other embodiments are within the scope of the following claims. In some cases, the actions recited in the claims can be performed in a different order and still achieve desirable results.

Terminology used herein is for the purpose of describing particular embodiments only and is not intended to be limiting of the invention. For example, as used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. As used herein, the term "and/or" includes any and all combinations of one or more of the associated listed items and may be abbreviated as "/".

Spatially relative terms, such as "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is inverted, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly. Similarly, the terms "upwardly", "downwardly", "vertical", "horizontal" and the like are used herein for the purpose of explanation only unless specifically indicated otherwise.

Although the terms "first" and "second" may be used herein to describe various features/elements (including steps), these features/elements should not be limited by these terms, unless the context indicates otherwise. These terms may be used to distinguish one feature/element from another feature/element. Thus, a first feature/element discussed below could be termed a second feature/element, and similarly, a second feature/element discussed below could be termed a first feature/element without departing from the teachings of the present invention.

What is claimed is:

1. A method of manufacturing a touch sensor with a conductive micro-mesh comprising:
    applying the catalytic photoresist composition onto a transparent substrate of the touch sensor;
    photo patterning the catalytic photoresist composition to have a layer of catalytic photoresist pattern;
    plating a metal layer on the layer of catalytic photoresist pattern thereby forming the conductive micro-mesh;
    applying a metal passivation layer over the metal layer;
    degassing a clear protective coating solution;
    applying the clear protective coating over the metal passivation layer; and
    curing the protective coating prior to attaching a flex cable to the touch sensor.

2. The method of claim 1, wherein applying a protective coating comprises applying a solution comprising: 70%-80% monofunctional acrylic oligomers and 20%-30% solvent.

3. The method of claim 2, wherein the curing is performed by baking the protective coating.

4. The method of claim 3, wherein the baking is performed at a temperature of from about 100 to about 120 degrees Celsius, for a period of from 30 to about 40 seconds.

5. The method of claim 2, further comprising including 1-6% photoinitiators in the solution and wherein the curing is performed by irradiating the protective coating with UV radiation.

6. The method of claim 1, wherein applying the protective coating comprises applying coating solution over the conductive micro-mesh and a bond pad area of the touch sensor.

7. The method of claim 6, further comprising adhering the flex cable to the bond pad area.

8. The method of claim 7, wherein adhering the flex cable comprises causing solder particle suspended in an adhesive to penetrate the protective coating.

9. The method of claim 1, wherein applying the protective coating comprises applying a protective solution to a thickness of 1-2 microns.

10. The method of claim 1, wherein curing the protective coating comprises applying one of thermal partial curing and irradiation partial curing.

11. A conductive mesh touch sensor comprising:
    a transparent substrate;
    a layer of catalytic photoresist patterns made of a catalytic photoresist composition, the catalytic photoresist composition including a photoresist and catalytic nanoparticles;
    a metal conductive layer with conductive patterns forming a conductive mesh over the layer of catalytic photoresist patterns;
    a metal passivation layer over the metal layer;
    a clear protective coating over the metal passivation layer; and
    a flex cable provided over the clear protective coating.

12. The touch sensor of claim 11, wherein the metal conductive layer includes copper and the metal passivation layer includes palladium.

13. The touch sensor of claim 12, wherein the clear protective coating covers the conductive mesh and a bond pad area of the touch sensor.

14. The touch sensor of claim 13, wherein the flex cable is attached to the bond pad with adhesive, the adhesive comprising a plurality of solder particles that penetrate the clear protective coating.

15. The touch sensor of claim 11, wherein the clear protective coating includes monofunctional acrylic oligomers.

16. The touch sensor of claim 12, wherein the clear protective coating has a thickness of between 1 to 3 micrometers.

17. A touchscreen, comprising:
    a display device;
    a touch sensor over the display device;
    a cover lens; and,
    an optically clear adhesive or resin between the touch sensor and the cover lens;
    wherein the touch sensor comprises: a transparent substrate; a layer of catalytic photoresist patterns of a catalytic photoresist composition, the catalytic photoresist composition including a photoresist and catalytic nanoparticles; a metal conductive layer with conductive patterns over the layer of catalytic photoresist patterns; a metal passivation layer over the metal layer; and a transparent protective layer over the metal passivation layer.

18. The touchscreen of claim 17, wherein the clear protective coating includes monofunctional acrylic oligomers.

19. The touchscreen of claim 17, wherein the transparent protective layer covers the metal passivation layer and a bond pad area of the touch sensor.

20. The touchscreen of claim 19, further comprising a flex cable attached to the bond pad with adhesive, the adhesive comprising a plurality of solder particles that penetrate the transparent protective layer.

21. The touchscreen of claim 17, wherein transparent protective layer comprises partially cured monofunctional acrylic oligomers.

22. A touch sensor, comprising:
    a transparent substrate;
    a metal conductive layer with conductive patterns and bond pads formed over the transparent substrate;
    a metal passivation layer over the metal layer;
    a transparent protective layer over the metal passivation layer and the bond pads;
    a flex cable attached to the bond pad and having a plurality of solder particles that penetrate the transparent protective layer and contact the bond pads.

* * * * *